United States Patent [19]

Najam

[11] Patent Number: 5,521,491

[45] Date of Patent: May 28, 1996

[54] PHASE DETECTING DEVICE FOR DETERMINING PHASE ANGLE BETWEEN TWO ELECTRICAL SIGNALS

[75] Inventor: Zahid Najam, San Jose, Calif.

[73] Assignee: Echelon Corporation, Palo Alto, Calif.

[21] Appl. No.: 441,957

[22] Filed: May 16, 1995

Related U.S. Application Data

[63] Continuation of Ser. No. 111,150, Aug. 23, 1993, abandoned.

[51] Int. Cl.$^6$ .................................................. G08B 25/00
[52] U.S. Cl. ............................. 324/86; 324/66; 324/521; 340/538; 340/310.01; 340/658
[58] Field of Search ..................................... 324/107, 108, 324/66, 521, 527, 528, 86; 340/658, 310.01, 538

[56] References Cited

U.S. PATENT DOCUMENTS

| | | | |
|---|---|---|---|
| 3,775,676 | 11/1973 | Harrold | 324/521 |
| 4,011,503 | 3/1977 | Ferrara | 324/76.77 |
| 4,225,966 | 9/1980 | Blow | 324/76.77 |
| 4,626,622 | 12/1986 | Bouvrette | 324/66 |
| 4,680,620 | 7/1987 | Baker | 324/76.77 |
| 4,775,839 | 10/1988 | Kosina | 324/520 |

FOREIGN PATENT DOCUMENTS

| | | | |
|---|---|---|---|
| 0092155 | 8/1978 | Japan | 324/86 |

*Primary Examiner*—Kenneth A. Wieder
*Assistant Examiner*—Jose M. Solis
*Attorney, Agent, or Firm*—Blakely, Sokoloff, Taylor & Zafman

[57] ABSTRACT

A transmitting box is connected to a first electrical outlet in a building. The phase of the first electrical outlet is used as the reference phase. The transmitter box senses each of the zero-cross-overs of the reference phase and injects a data packet of the data carrier frequency at each zero-cross-over. A receiving box is connected to a second electrical outlet in the building. The second electrical outlet has an unknown phase which may be different from the reference phase. The receiver box receives each data packet and senses each phase zero-cross-over of the unknown phase. The receiver box uses the time between each reception of a data packet and each detection of an unknown phase zero-cross-over to determine the phase angle of the unknown phase relative to the reference phase.

13 Claims, 8 Drawing Sheets

PHASE DETECTION BLOCK DIAGRAM

NOTES:
JP1 - IN - TRANSMITTER
JP1 - OUT - RECEIVER
JP2 - IN - 60 HZ UNIT
JP2 - OUT - 50 HZ UNIT

PHASE DETECTING DEVICE FOR DETERMINING PHASE ANGLE BETWEEN TWO ELECTRICAL SIGNALS

This is a continuation of application Ser. No. 08/111,150, filed Aug. 23, 1993 now abandoned.

FIELD OF THE INVENTION

The present invention relates to processes and mechanisms for phase identification, or determination of relative phase angle, in a polyphase electrical power distribution systems.

BACKGROUND OF THE INVENTION

Electrical power line generation, distribution, and utilization commonly involves polyphase systems, in which several sinusoidal voltage sources equal in magnitude but different in phase are employed. Polyphase systems include two phase and three phase systems. Three phase systems offer economic and operating advantages, and are the most common. The respective voltages of a three phase system are normally generated by the same machine or generator. A power load may utilize all of the phases or a single phase of a polyphase power distribution system. For example, machinery found a in heavy industrial environment frequently draws power from all three phases. Other loads may only be connected across any one of the phases (line and the neutral). The majority of electrical products sold for general use are intended for connection to a single phase.

FIG. 1 shows three voltage sources Va, Vb, and Vc in a three phase system. Each source may be, for example, one hundred volts, as measured across the generating source. Source Va, for example, is one hundred volts, as measured from a voltage point "a" to a point "o." If the generating source Va is taken as the reference with a phase angle of zero (0) degrees, then the phase angle of Vc will be one hundred twenty (120) degrees and the phase angle of Vb will be two hundred forty (240) degrees.

A phasor diagram of the three sources Va, Vb, and Vc is shown in FIG. 2. Shown in the figure are source Va at 0 degrees, source Vc at 120 degrees, and source Vb at 240 degrees. Note that source Vb may also be measured as having a phase angle of negative 120 degrees. Thus, the relationship between each of the sources Va, Vb, and Vc in the three phase system is that each source is 120 degrees out of phase with the other generating sources.

The three sources Va, Vb, and Vc of FIG. 1 may be connected with their respective "o" points tied together to form a Y-connection, as shown in FIG. 3. Alternatively, the three sources Va, Vb, and Vc may be connected with each "o" point joined to a corresponding voltage point of another source, as shown in FIG. 4. The configuration of FIG. 4 is known as a delta-connection.

In the Y configuration connection of FIG. 3, lines which extend from the voltage sources Va, Vb, and Vc form the three phases distribution system. The common point (or neutral) may or may not be distributed as a fourth line. If the neutral is distributed then the system is a four-wire three phase system. In the delta-configuration of FIG. 4, there is no neutral. The four wire three phase system of FIG. 3 is almost universally used to distribute power within commercial buildings, and hence the presently preferred embodiment is described using this configuration. The present invention, however, may also be used with a two phase or delta-distribution system.

In the past, it generally has not been important in a multi-phase system to identify the respective phases of particular power outlets, other than at the time of wiring the building so that the loads could be equally distributed on all the phases. Recently, however, power distribution lines have been used increasingly for data communication, due to the cost savings achieved by avoiding the installation of dedicated communication cabling. By utilizing the power distribution wire, the need for other forms of communication media (e.g., twisted pair, coax cable) may be eliminated, while allowing the transfer of data between devices that are connected to the power line at various outlets throughout a building.

When a polyphase power distribution is used for communication, it is beneficial, and in some cases essential, to identify the phase of various power outlets. This is often necessary since the difficulty of cross phase communication frequently dictates the installation of additional devices to provide more reliable communication between phases.

Power lines may not be ideal for data communication media, since power line characteristics do not readily transmit frequencies needed for useful data rates. The inductance of the power lines and the loading of equipment connected across these power lines causes attenuation of the data signals, for example. Also, appliances such as motors, light dimmers, switching mode power supplies, television (TV) sets, and fluorescent light ballasts couple noise on to the power lines which can degrade data communication signals. Moreover, in buildings that use the three phase four wired system, data signals on one phase are coupled to other phases by means of parasitic inductance and capacitance between distribution lines and within distribution transformers. The present invention relies on the parasitic coupling between phases for transmission of data packets across polyphases distribution system. However, the present invention does not require the degree of parasitic coupling needed by control or data systems, as only small amounts of data need to be successfully communicated with relatively low reliability.

In retrofitting a building for a control network, where the power lines will be used for both AC power and data communications, the above shortcomings can be effectively combated once Phase identification is accomplished. Phase identification involves the determination of the relative phases of power outlets with respect to each other. If upon installation of a power line communication system it is found that there is high signal attenuation between the phases (i.e., insufficient transmitted signal propagated from a reference phase outlet to another outlet of a phase being tested) then appropriate network components or devices may be inserted to overcome the degradation of the signal.

SUMMARY OF THE INVENTION

The present invention provides an effective means for identifying the individual phases at each electrical outlet of a building having a polyphase electrical power distribution system. The apparatus of the present invention includes a transmitting unit and a receiving unit. The transmitting unit can be plugged into an electrical outlet. The phase of that outlet will be treated as the reference phase against which the phase at other outlets will be compared. The transmitting unit injects a data packet onto the reference phase outlet at a predetermined point on the AC waveform. The prefered embodiment injects a data packet at the point where the sinusoidal voltage of the reference phase is approximately zero and is positive-going with respect to the neutral line. It should be noted that any point on the AC waveform could be chosen as the data packet injection point. For simplicity, only the zero cross-over with a positive slope point will be described herein.

In the presently preferred embodiment, the receiver is a portable unit that can be plugged into an electrical outlet where the phase is unknown. The receiver unit is able to receive the data packet from the transmitter unit over the power lines and can also detect each point in time when the AC voltage of the unknown phase is crossing zero voltage with a positive slope. The receiver unit can then determine the phase angle and identify the unknown phase relative to the reference phase based on the amount of time measured between reception of the data packet and detection of the point in time when the voltage of the unknown phase is zero-crossing with positive slope.

According to the method of the present invention, the transmitter unit is connected to the reference electrical outlet having a reference phase, and places a reference data packet on the power line at each point in time when the phase voltage is zero-crossing with a positive slope. The receiver unit is connected to an electrical outlet having an unknown phase. The receiver unit can then receive the reference data packet, and can determine the positive going sinusoidel voltage phase zero-cross-over point.

The receiver unit, upon reception of the reference data packet, starts a timer. The timer is stopped at a point when the voltage at the unknown phase outlet is approximately zero with positive slope. The receiver unit then computes the difference between the start time and the stop time, and determines the phase angle of the unknown phase relative to the reference phase, based upon that computed difference.

DETAILED DESCRIPTION OF THE INVENTION

A method and apparatus for determining the phase angle between electrical signals in a polyphase electrical power distribution system will now be described. In the following description, numerous specific details are set forth such as voltages, frequencies, etc. in order to provide a thorough understanding of the present invention. It will be evident, however, to those skilled in the art that these specific details need not be used to practice the present invention. In other instances, well-known structures and circuits have not been shown in detail in order to avoid unnecessarily obscuring the present invention.

Figure 1:
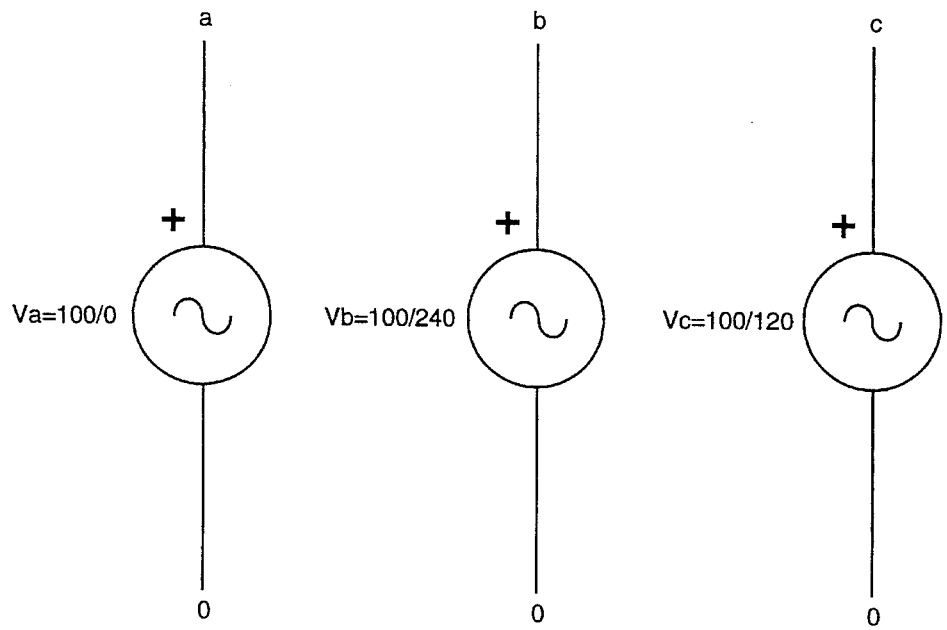
FIG. 1 is a schematic diagram of three voltage sources in a three phase power distribution system, according to the prior art.
Figure 2:
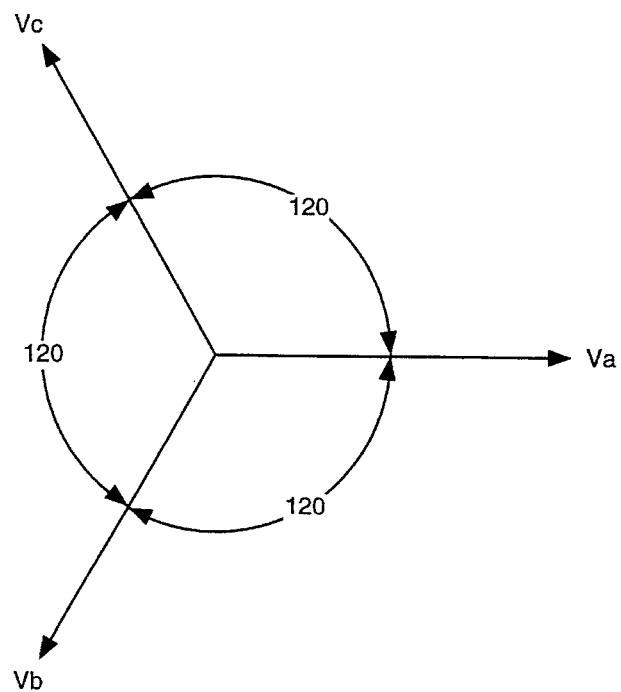
FIG. 2 is a phaser diagram of the three voltage sources in a three phase power distribution system, according to the prior art.
Figure 3:
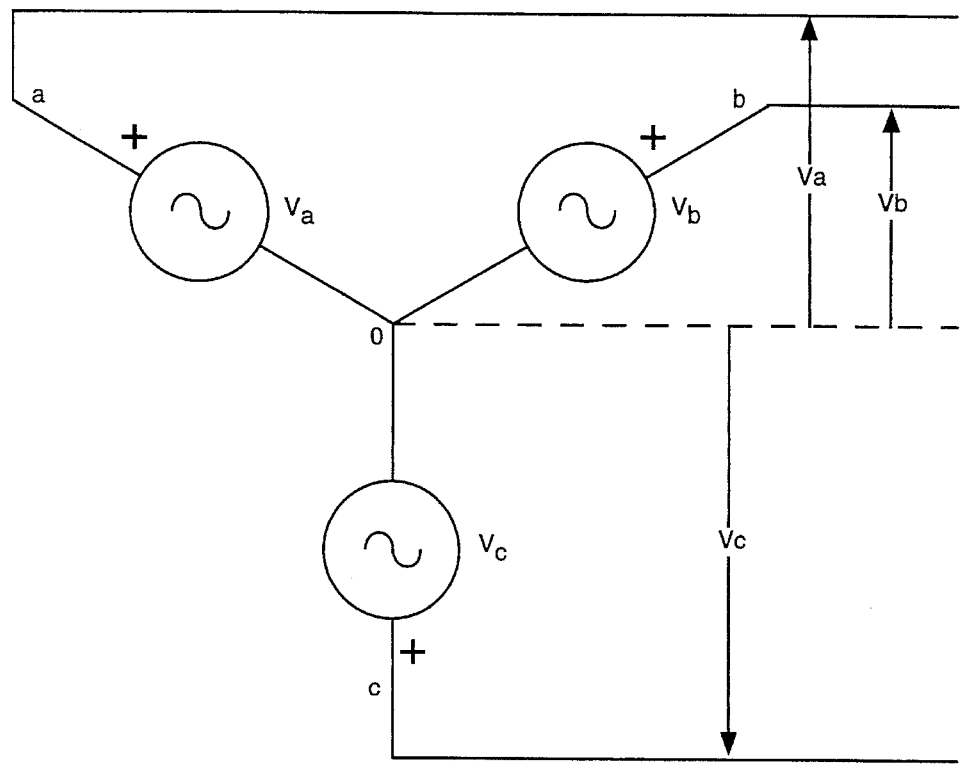
FIG. 3 is a schematic diagram showing the three voltage sources configured in a Y-connection, according to the prior art.
Figure 4:
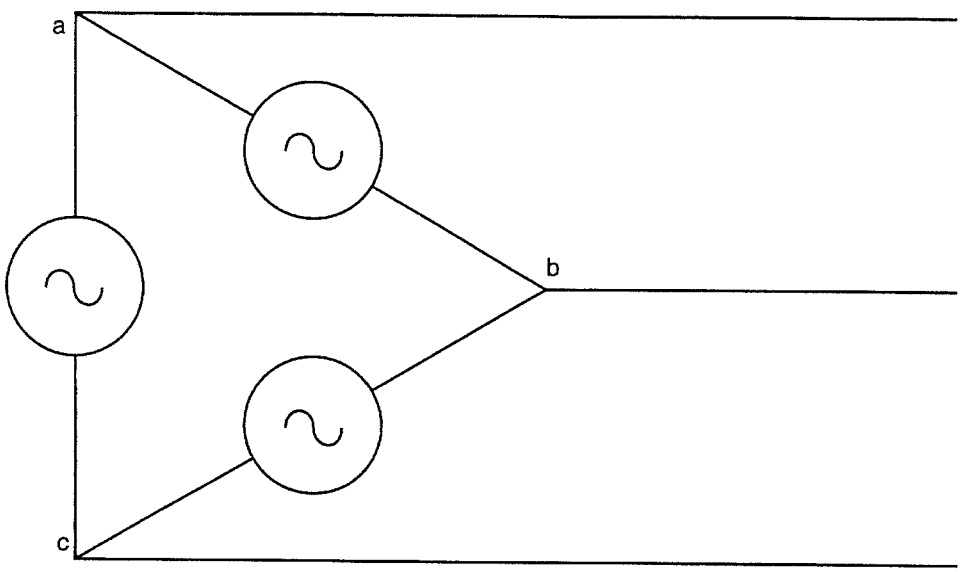
FIG. 4 is a schematic diagram showing the three voltage sources configured in a delta-connection, according to the prior art.
Figure 5:
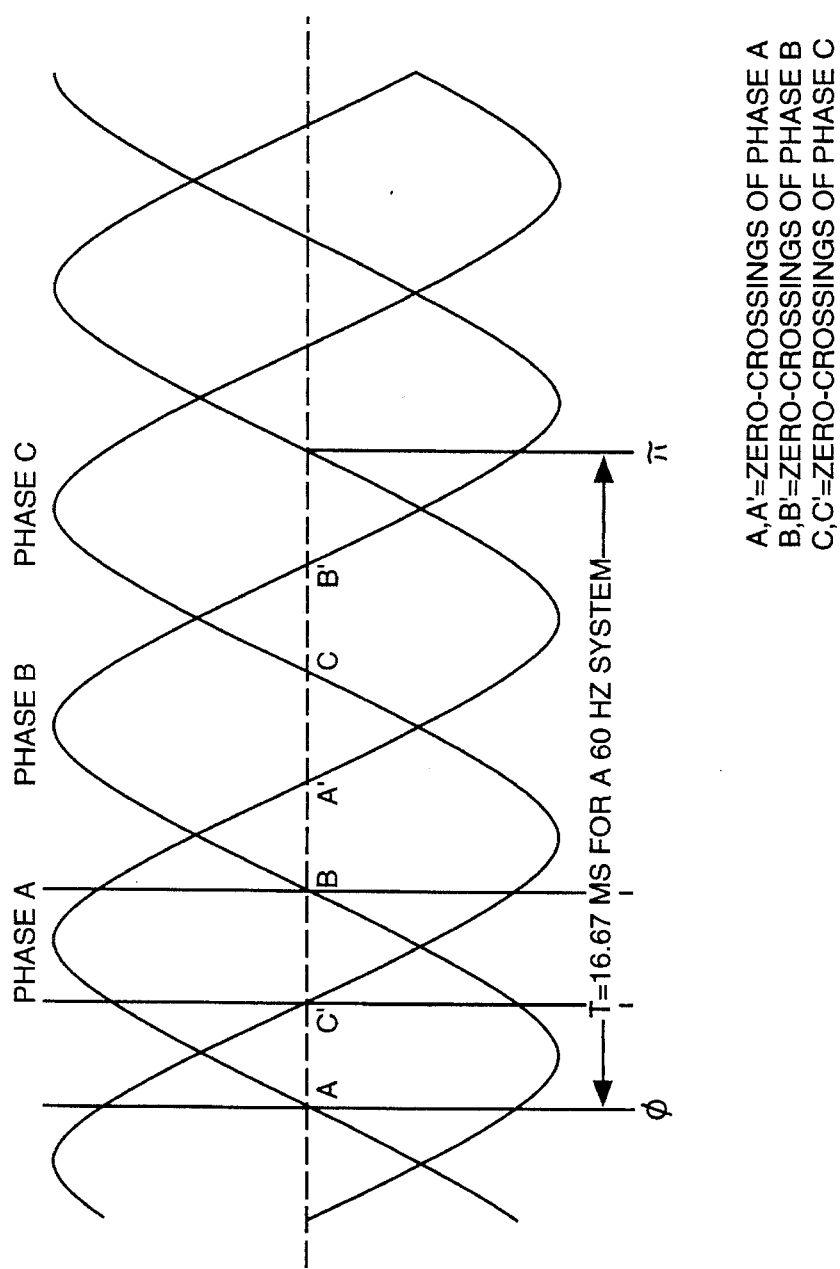
FIG. 5 is a schematic diagram showing the time relationship for a three phase system.

Turning to FIG. 5, the time relationship for a three phase system is depicted. In a polyphase system, a phase angle separates the several sources. That is, the different generating sources achieve different voltage values at different times because their phase angles are different from one another. In the three phase system of FIG. 5, the phase separation is 120 degrees between each phase. While, the instantaneous voltage of any one phase may be calculated, for simplicity, only the zero-cross-over points with positive slope will be considered here for this application. Thus, if at a given time the phase voltage of Phase A is 0 volts, then the corresponding zero-cross-over of phase B will be at 120 degrees relative to phase A, and the respective zero cross-over of Phase C would be 240 degrees relative to Phase A. A two phase system would have a phase separation of 180 degrees.

From FIG. 5 it is seen that the zero-cross-overs (when the respective voltage of any one phase is zero) of each of the phases are quite distinctive and identifiable in the time domain. The zero-cross-overs of Phase A are shown at points A and A'; the zero-cross-overs of Phase B are shown at points B and B'; and the zero-cross-over of Phase C are shown at points C and C'. The time separation of each phase zero-cross-over is fixed with respect to the other phases and can be calculated by knowing the power system frequency. Thus, for a 60 Hz, three phase system, a zero-cross-over occurs on one of the three phases every 2.78 ms and is indicated by A, C', B, A', C, B' in FIG. 5. For a single phase of the three phase system, the zero-cross-over occurs at every 8.33 ms, and the positive slope zero-cross-over occurs at every 16.67 ms (once each complete AC cycle).

According to the present invention, any one of the three phases can be used as a reference phase, and the other two phases can be identified by their respective zero-cross-over points, relative to the reference phase zero cross-over. Using the Phase A zero cross-over with a positive slope as a reference, for example, the occurrence in time of the Phase B and Phase C zero-cross-overs can be determined. This procedure can effectively provide relative phase identification for the three phases in a building.

The present invention uses the zero-cross-over point with positive slope of the sinusoidal waveform (or any other definable point of the alternating voltage waveform) of any one phase as a reference, and then compares the positive slope zero-cross-over point of the unknown phase against the reference to determine its relative phase angle. For instance, if the unknown phase zero-cross-over occurs at 0 degrees or at a time point t=0 ms with respect to the zero-cross-over of the reference phase, then both signals have the same phase. This situation would mean, for example, that the signals in both the reference electrical outlet and the unknown electrical outlet are of Phase A.

If the unknown phase zero-cross-over occurs at 5.56 ms after the reference phase zero-cross over, then the unknown phase is lagging the reference phase by 120 degrees. Looking at FIG. 5, if the reference zero-cross-over is at point A, then the signal having a zero-cross-over 5.56 ms after point A is the Phase B signal.

If the time between the reference phase zero-cross-over and the unknown phase zero-cross-over is equal to the time of 11.12 ms, then the unknown phase is leading the reference phase by 120 degrees. In FIG. 5, if the reference zero-cross-over is at point A, then the signal having a zero-cross-over 11.12 ms after point A is the Phase C signal.

The presently preferred embodiment uses a transmitter unit and a receiver unit. The transmitter unit is connected into a phase which is to be used as the reference, and the receiver unit is portable and can be taken around the building to the outlets having phases which need to be identified.

Figure 6:
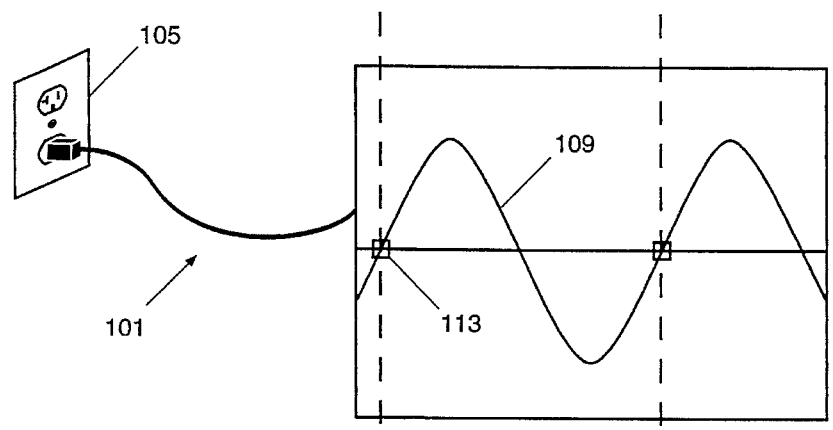
FIG. 6 is a schematic diagram showing the reference phase of a first electrical outlet and the unknown phase of a second electrical outlet.
Figure 6:
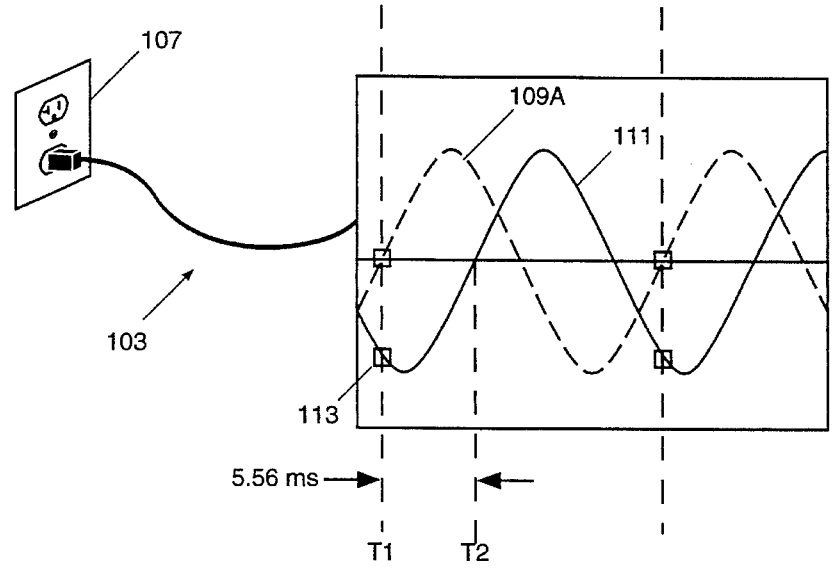

The transmitter unit and the receiver unit are symbolically represented in FIG. 6 at 101 and 103, respectively. The two units 101 and 103 plug into electrical outlets 105 and 107, respectively. The representation of the transmitter unit 101 shows the signal 109 that the transmitter unit 101 receives from electrical outlet 105. This signal 109 is assumed to be of Phase A in the presently preferred embodiment.

Similarly, the receiver unit 103 receives a signal 111 from electrical outlet 107. For purposes of this illustration, this signal 111 is assumed to be of Phase B. A dashed line 109A represents the relative position of the Phase A signal 109. The dashed line 109A is shown for reference only, and is not received from electrical outlet 107.

The transmitter unit 101 senses each positive going slope zero-cross-over of the Phase A signal 109 and injects a short data packet 113 of the data carrier frequency onto the power line via outlet 105. The receiver unit 103 receives the small data packet 113 which was sent by the transmitter unit 101, and uses that as an indicator of the reference phase zero-cross-over. The dashed line 109A shows the position of the reference Phase A signal 109 superimposed on the unknown signal 111. The receiver unit 103 uses the reception of the data packet 113 as a time-zero stamp, and times from that to the zero-cross-over point with positive slope of the unknown phase 111 in order to determine the phase angle of the unknown phase 111. In this example, the time is 5.56 ms, which means that the unknown phase 111 is determined to be of Phase B.

Figure 7:
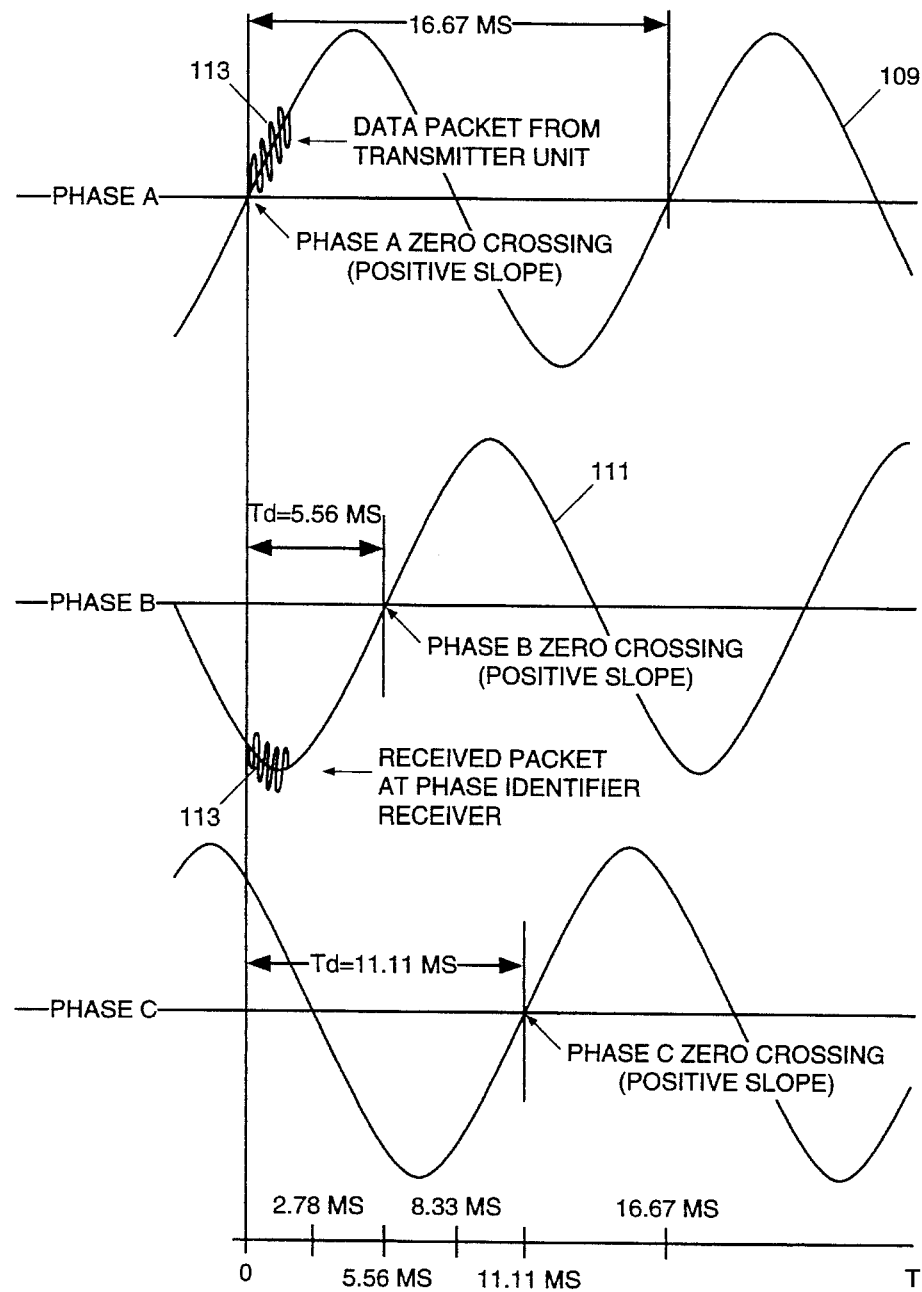
FIG. 7 is a schematic diagram showing insertion of a data packet on a reference Phase A and detection of the packet on an unknown Phase B.

FIG. 7 shows the injection of a data packet 113 onto reference signal 109 (which is of Phase A in this example) at the Phase A positive-going-slope zero-cross-over. The receiver unit 103 detects the data packet 113 and starts timer. On detecting a positive-slope zero-cross-over, the timer is stopped and a reading the timer shows a value of 5.5.6 ms. If the receiver unit 103 were connected to a Phase C electrical outlet, for example, then a time of 11.11 ms from reception of the data packet 113 to detection of the positive-slope zero-cross-over of the Phase C signal would indicate that the reference signal was of Phase C.

Figure 8:
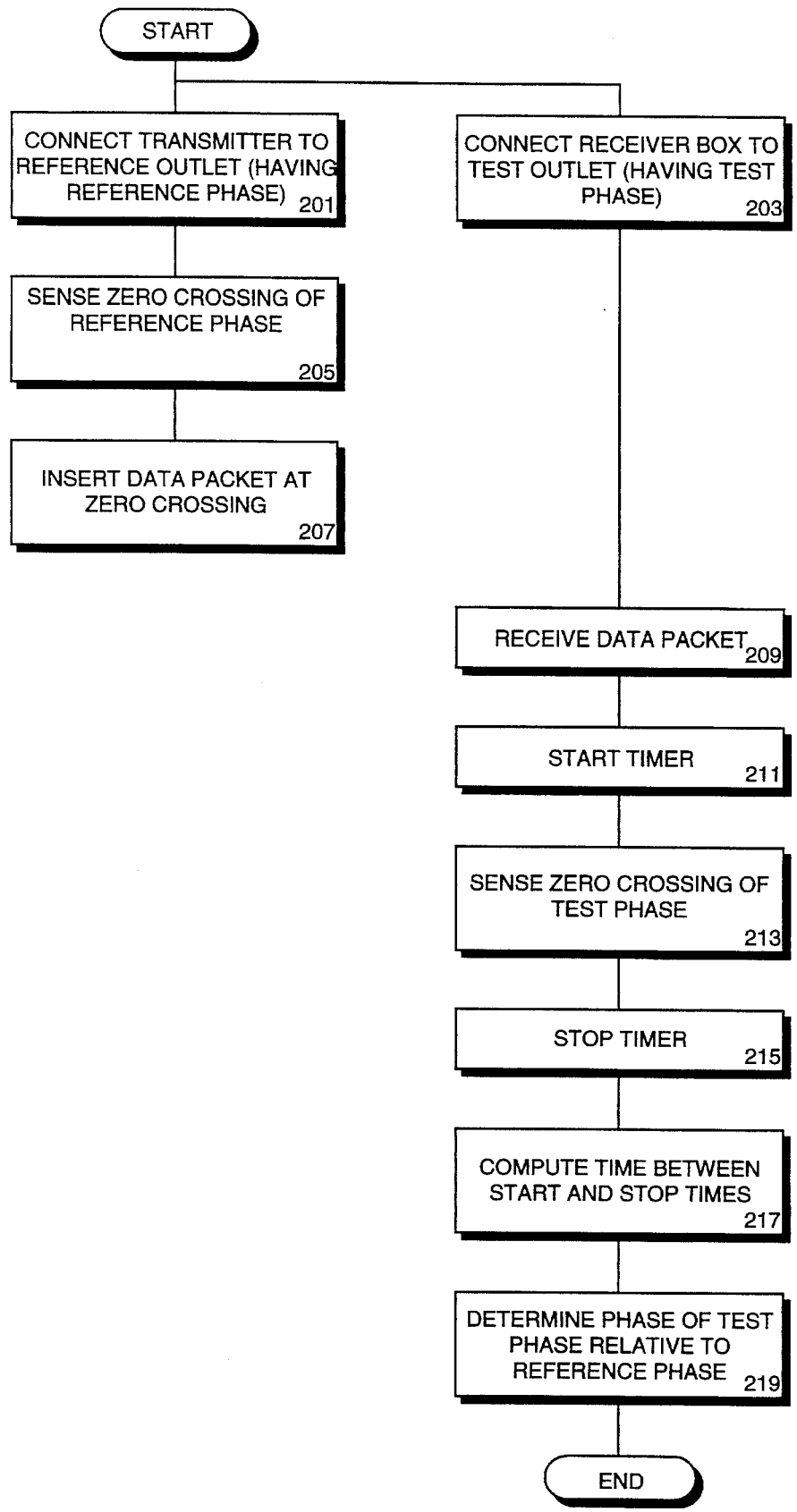
FIG. 8 is a flowchart showing the method of the present invention.

The method of the present invention, according to the presently preferred embodiment, is now described with reference to FIG. 8. At Step 201, the transmitter unit 101 is connected to the reference electrical outlet 105 having a reference signal 109 with a reference phase. At Step 203, the receiver unit 103 is connected to an unknown electrical outlet 107 having an unknown signal 111 with an unknown phase. The transmitter unit 101 senses a point in time when the voltage of the reference signal 109 is approximately zero with positive slope (at Step 205), and at Step 207 inserts a data packet 113 into the reference signal 109.

The receiver unit 101 receives the data packet 113 at Step 209, and upon such reception starts a timer at Step 211. The receiver unit 103 also senses a point in time when the voltage of the unknown phases 111 is approximately zero with positive slope (at Step 213), and stops the timer at that time as shown at Step 215. The receiver unit 103 then computes the difference between the start time and the stop time at Step 217. At Step 219, the receiver unit 103 determines the phase angle of the unknown phase relative to the reference phase based upon that computed difference.

Figure 9:
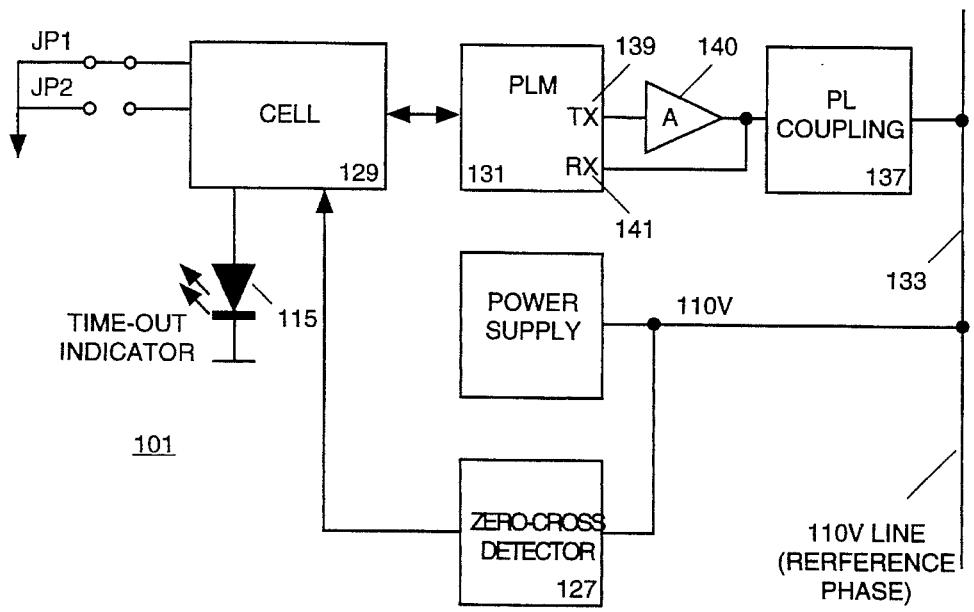
FIG. 9 is a block diagram showing the circuitry of the transmitter unit according to the presently preferred embodiment.
Figure 10:
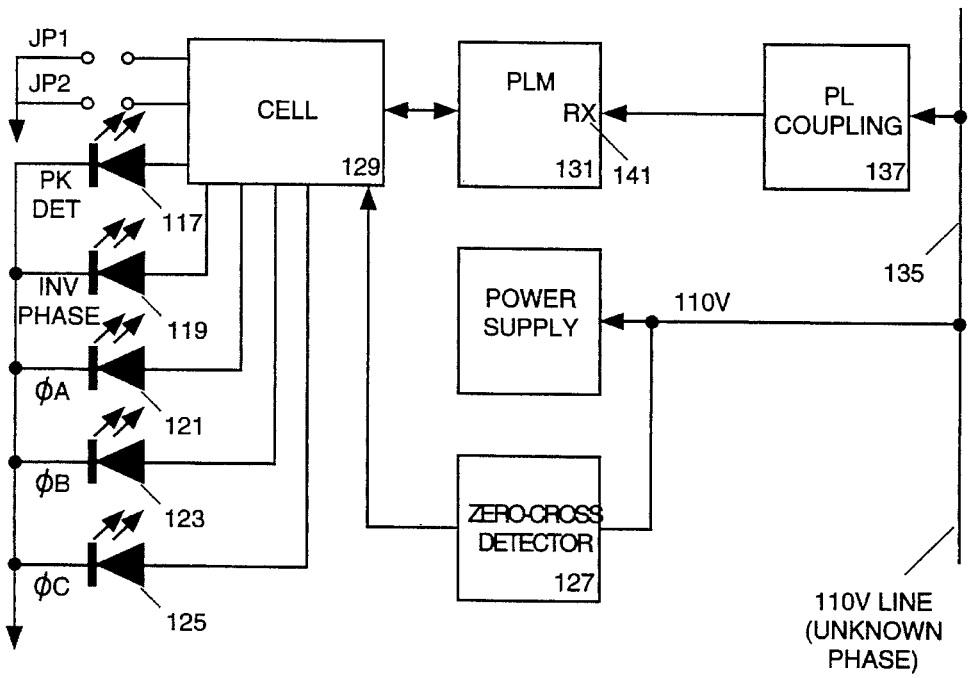
FIG. 10 is a block diagram showing the circuitry of the receiver unit according to the presently preferred embodiment.

The circuitry of the transmitter unit 101 of the presently preferred embodiment is shown in FIG. 9, and the circuitry of the receiver unit 103 of the presently preferred embodiment is shown in FIG. 10. As embodied herein, both units comprise the same hardware, and can be configured as transmitter unit 101 or as receiver unit 103 according to the "JP1" and "JP2" switches. Moreover, the units 101, 103 can be configured as 60 Hz units or 50 Hz units, the latter being for operation in Europe, according to the "JP1" and "JP2" switches. For the United States, the transmitter unit 101 is configured with the JP1 switch closed (transmitter mode) and with the JP2 switch open (60 Hz mode), and the receiver unit 103 is configured with the JP1 switch open (receiver mode) and with the JP2 switch open (60 Hz mode).

The transmitter unit 101 of FIG. 9 uses a time out indicator 115, which is a light emitting diode (LED). Receiver unit 103 uses 5 LEDs: a data packet detection indicator LED 117; an inverted phase indicator LED 119; a Phase A indicator LED 121; a Phase B indicator LED 123; and a Phase C indicator LED 125. The data packet detection indicator LED 117, when activated, indicates communication between the transmission unit 101 and the receiver unit 103. For instance, if the line connected to the transmission unit 101 is isolated from the line connected to the receiver unit 103 then LED 117 would not be lit, thus indicating that the receiver unit 103 is not receiving data packets.

The inverted phase detector LED 119 indicates that the receiver unit 103 is detecting a packet that is 180 degrees out of phase. The time between the zero-crossing of the reference phase and the unknown phase will be 8.33 ms. The above shows that this invention will work equally well in two phase environments as well.

The receiver unit 103 may find the reference phase to be: Phase A in which case the Phase A indicator LED 121 is activated; Phase B in which case the Phase B indicator LED 123 is activated; or Phase C in which case the Phase C indicator LED 125 is activated. Regarding the inverted phase detector LED 119, in the case where a phase line was wired incorrectly such that that phase is 180 degrees out of phase with what it should be, the inverted phase detector LED 119 is activated. For example, if an electrical outlet having a Phase A signal was incorrectly wired, then the positively sloped zero-cross-overs occur when the negatively sloped zero-cross-overs should occur and vice-versa. Two phase 180 degrees out of phase power wiring situations are quite common for private dwellings in the USA.

The zero-cross detector 127 of FIGS. 9 and 10 identifies each phase positive-going zero-cross-over in order to start operations, such as when to send a data packet on the line in the case of the transmitter unit 101 configuration. In the receiver unit 103 configuration, the zero-cross detector 127 detects each zero-cross-over with positive slope so that the receiver unit 103 can stop a timer (which may be located within cell 129) to determine the time between the time that the data packet 113 is received and the zero-cross-over.

The cell 129 of FIGS. 9 and 10 is the controlling processor and is application driven. In the presently preferred embodiment, the NEURON® Chip, which is a product of the Assignee of the present invention, is implemented as cell 129. The cell 129 controls timing functions, drives the LED indicators, and handles communications with the power line modem 131 (also a product of the Assignee of the present invention) to send and receive data packets 113.

In the transmitter unit 101 configuration of FIG. 9, the power line modem 131, when instructed by cell 129, places a data packet on the line 133. Amplifier 140 amplifies the data packet signal. In the receiver unit 103 configuration of FIG. 10, the power line modem 131 monitors the line 135 for incoming data packets 113, receives the data packets 113, and forwards the data packets 113 to the cell 129. The power line modem 131 has a transmitting section 139 and a receiving section 141.

The power line coupling 137 of FIGS. 9 and 10 blocks the unwanted 60 Hz low frequency contents (50 Hz in the case of European operation) of the line. The power line coupling 137, in the case of the transmitter unit 101 configuration, couples the high frequency data carrier signal (data packet) to the line 133. In the case of the receiver unit 103 configuration, the power line coupling 137 couples the data packet from the line 135 to the receiver section 141 of the power line modem 131. In the presently preferred embodiment for operation in the United States, the frequency of the data packet is between 100 Khz and 450 KHz. Other frequencies, however, may be used. The information contained in the data packet can be any sequence of logical "0"s and "1"s recognizable by a receiver.

Figure 11:
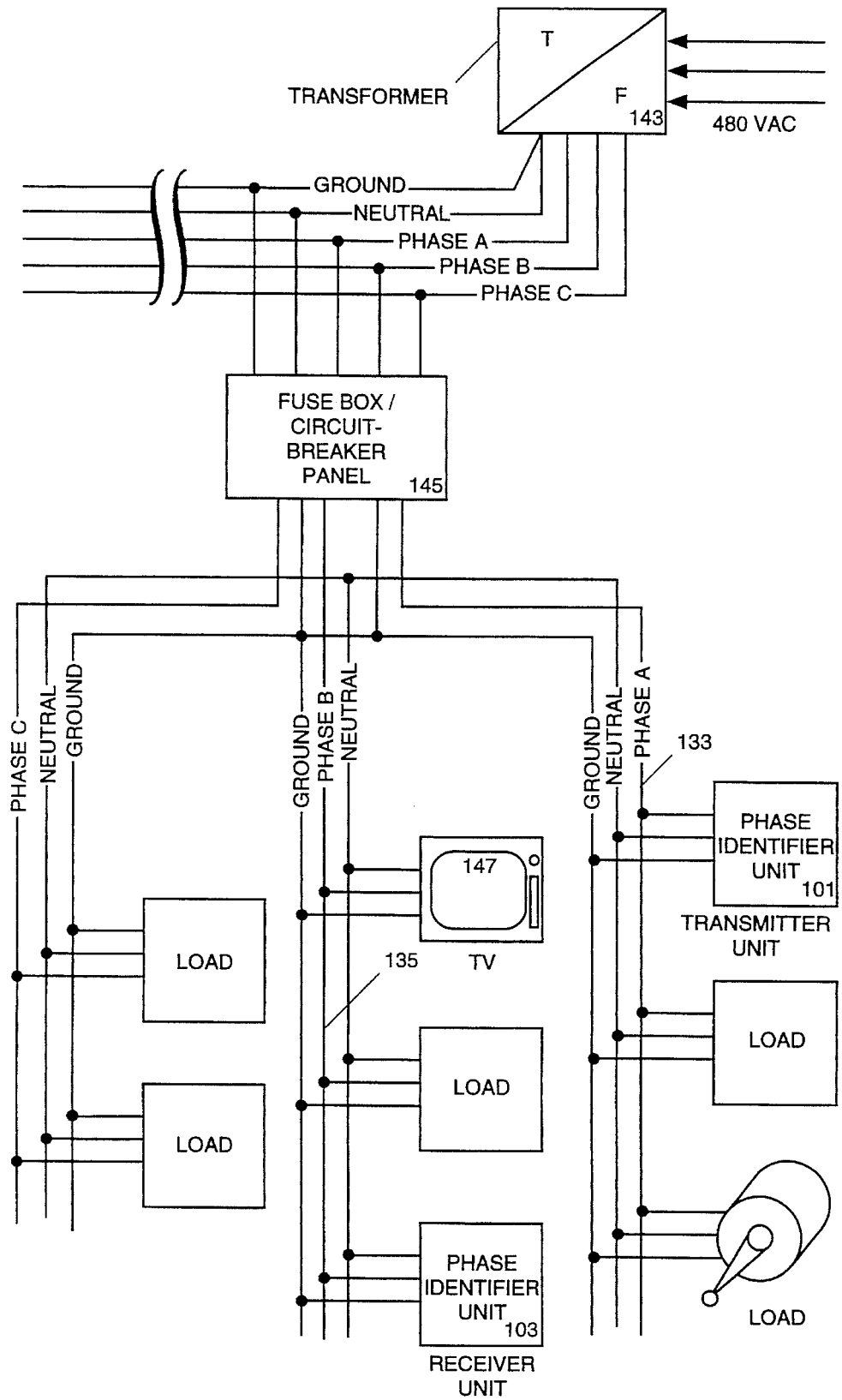
FIG. 11 is a block diagram showing the transmitter unit and the receiver unit of the presently preferred embodiment connected to a three phase electrical power distribution system.

A block diagram showing the transmitter unit 101 and the receiver unit 103 operating in a typical three phase power distribution system is shown in FIG. 11. Transformer 143 outputs a ground, neutral, Phase A, Phase B, and Phase C. Usually the ground and neutral are shorted together at the transformer 143, and usually the power is defined between the neutral and the phase lines. The ground usually serves as a safety line. These five lines are fed through a circuit breaker panel 145 and then into a typical distribution in a building, for example. Single phase loads, such as television 147, are each connected between a single phase, such as Phase B and neutral. The transmitter unit 101 is shown connected to a Phase A line and the receiver unit 103 is shown connected to a Phase B line.

Turning back to FIG. 9, the operation of the transmitting unit 101 is as follows. The zero-cross detector 127 detects each positively sloped zero-cross-over and indicates to cell 129 that the crossover has occured which in turn instructs the power line modem 131 to put a small data packet 113 onto line 133. In the preferred embodiment, each data packet 113 is approximately 3 ms in duration. The data packet is amplified by amplifier 140 and then placed on line 133 via the power line coupling 137. The packet propagates on the line on the particular phase, in this case Phase A.

The receiver unit 103 of FIG. 10 may be on the same phase as the transmitter unit 101 or another phase, in this case Phase B. The data packet 113 passes through the power line coupling 137 and into the power line modem 131. The power line modem 131 distinguishes that the data packet 113 is not noise and is a valid packet. The power line modem 131 then sends the data packet 113 to cell 129. Additionally, the zero-cross detector 127 monitors the line 135 and sends a pulse to the cell 129 when a positively sloped zero-cross-over occurs.

The cell 129 associates the time that the data packet 113 was received with the time that the zero-cross-over on line 135 occurred. If the times of both the receipt of the data packet 113 and the zero-cross-over are the same, then the unknown phase on line 135 is the same phase as the reference phase. If the time difference is 5.56 ms or 11.11 ms then the cell 129 determines that the phase is Phase B or Phase C.

If the phase on line 135 in inverted (180 degrees out of phase) then the cell 129 determines the inverted phase as follows. If the phase on line 135 is Phase A, inverted, then the zero-cross-over would be detected 8.33 ms after reception of the data packet 113. If the phase on line 135 is Phase B, inverted, then the zero-cross-over would be detected 2.78 ms before reception of the data packet 113 (or 13.89 ms after reception of the data packet). If the phase on line 135 is Phase C, inverted, then the zero-cross-over would be detected 2.78 ms after reception of the data packet 113.

The cell 129 of the receiver unit 103 performs the above procedure approximately fifty times in the presently preferred embodiment before indicating a result. After fifty valid data packets are received at the appropriate times, then the cell 129 of the receiver unit 103 indicates the appropriate LED indicator combinations. For example, if line 135 has an inverted Phase B signal, then LEDs 119 and 123 are activated. The receiving unit 103 continues the above procedure, gathering data beyond fifty samples, to eliminate false data.

A user can repeat the above procedure, moving the receiving unit 103 from outlet to outlet, for example, until a desired representation of the wiring of a building is developed. Also, the reference phase is arbitrarily labeled Phase A, even if this phase is actually Phase B or C. The relative phase differences among the phases in the building and inversions thereof are accurately determined with the present invention. Upon such mapping of the outlets in a building, retrofitting the building for networking may be performed effectively and efficiently.

Whereas many alterations and modifications of the present invention will no doubt become apparent to a person of ordinary skill in the art after having read the foregoing description, it is to be understood that the particular embodiments shown and described by way of illustration are in no way intended to be considered limiting. For example, the concept of the present invention can be used not only to identify the phases of a three phase system, but can also be used with two phased systems. Moreover, the present invention need not be constructed with the elements shown in FIGS. 9 and 10. Discrete components may be used for the transmitter unit and the receiver unit. Also, a monotone signal of 200 KHz of 2 ms duration may be used, for example, as a data packet instead of digital data. With regard to FIGS. 9 and 10, an embodiment of the present invention may be implemented without the power line modem 131, amplifier 140, and power line coupling 137. In such an embodiment, data packets may be generated and sent from cell 129 on some other medium, such as via an antenna over radio frequency (RF), for example. The data packet could then be received through an antenna by the receiving cell 129 of FIG. 10. Therefore, reference to the details of the presently preferred embodiment are not intended to limit the scope of the claims which themselves recite only those features regarded as essential to the invention.

I claim:

1. An apparatus for use in a polyphase electrical power distribution system for determining the phase angle and wiring phase of an unknown phase voltage relative to a reference phase voltage, comprising:

a first circuit for generating a data packet at a point in time when a predetermined point of the reference phase voltage is detected, the data packet having a duration that is substantially shorter than the period of the reference phase voltage; and a second circuit for receiving the data packet and for detecting a point in time when a predetermined point of the unknown phase voltage occurs, the second circuit including means for determining the phase angle of the unknown phase voltage relative to the reference phase voltage based on an amount of time measured between reception of the data packet and detection of the point in time when the predetermined point of the unknown phase voltage occurs.

2. The apparatus for use in a polyphase electrical distribution system according to claim 1, the predetermined points of the reference and unknown phase voltages being defined by voltage values and slopes of the respective phases at those respective voltage values.

3. The apparatus for use in a polyphase electrical distribution system according to claim 2, wherein the predetermined point of the reference phase voltage is defined as a point on the reference phase voltage with a zero voltage and a positive slope, and wherein the predetermined point of the unknown phase voltage is defined as a point on the unknown phase voltage with a zero voltage and a positive slope.

4. The apparatus for use in a polyphase electrical distribution system according to claim 1, the first circuit being for generating a data packet and for injecting the data packet onto the reference phase voltage at the point in time when the predetermined reference point of the reference phase voltage is detected.

5. The apparatus for use in a polyphase electrical distribution system according to claim 1, the first circuit being for generating a data packet and for transmitting the data packet at the point in time when the predetermined reference point of the reference phase voltage is detected.

6. The apparatus for use in a polyphase electrical distribution system according to claim 5, wherein the data packet is transmitted on radio frequency.

7. An apparatus for use in a polyphase electrical power distribution system for determining the phase angle and wiring phase of an unknown phase voltage relative to a reference phase voltage, the unknown phase voltage and the reference phase voltage being parasitically coupled, the apparatus comprising:

a first circuit for placing a time-stamp signal onto the reference phase voltage when a reference point on the reference phase voltage is detected, the time-stamp signal having a duration that is substantially shorter than the period of the reference phase voltage;and a second circuit for receiving the time-stamp signal via the parasitic coupling and for detecting a reference point on the unknown phase voltage, the second circuit including means for determining the phase angle of the unknown phase voltage relative to the reference phase based on an amount of time measured between reception of the time-stamp signal and detection of the reference point on the unknown phase voltage.

8. The apparatus for use in a polyphase electrical distribution system according to claim 7, wherein the relative position of the reference point on the reference phase voltage is the same as the relative position of the reference point on the unknown phase voltage.

9. An apparatus for use in a polyphase electrical power distribution system for determining the phase angle and wiring phase of an unknown phase voltage relative to a reference phase voltage, comprising:

first detection means for detecting each point in time when a voltage of the reference phase voltage reaches approximately zero with positive slope;

first injection means for injecting a data packet onto the reference phase voltage at each of the detected points in time when a voltage of the reference phase voltage reaches approximately zero with positive slope, the data packet having a duration that is substantially shorter than the period of the reference phase voltage;

reception means for receiving each data packet;

second detection means for detecting each point in time when a voltage of the unknown phase voltage reaches approximately zero with positive slope; and determining means for determining the phase angle of the unknown phase voltage relative to the reference phase voltage, based on an amount of time measured between reception of a data packet and detection of a point in time when a voltage of the unknown phase voltage reaches approximately zero with positive slope.

10. A method for use in connection with a polyphase electrical power distribution system, the method for determining the phase angle and wiring phase of a unknown phase voltage in a second electrical outlet relative to a reference phase voltage in a first electrical outlet, comprising the following steps:

connecting a first circuit to the first electrical outlet, the first electrical outlet having a reference signal with a reference phase voltage;

connecting a second circuit to the second electrical outlet, the second electrical outlet having a unknown signal with a unknown phase voltage;

detecting each point in time when a voltage of the reference signal in the first electrical outlet reaches approximately zero with positive slope;

sending a data packet having a duration that is substantially shorter than the period of the reference phase voltage from the first circuit to the second circuit at each of the detected points in time when a voltage of the reference signal reaches approximately zero with positive slope;

receiving each data packet by the second circuit;

detecting each point in time when a voltage of the unknown signal reaches approximately zero with positive slope; and determining the phase angle of the unknown phase voltage relative to the reference phase voltage based on an amount of time measured between reception of a data packet and detection of a point in time when a voltage of the unknown signal reaches approximately zero with positive slope.

11. A method for use in a polyphase electrical power distribution system for determining the phase angle and wiring phase of an unknown phase voltage relative to a reference phase voltage, comprising the following steps:

sending a signal when a predetermined point of the reference phase voltage is detected, the signal having a duration that is substantially shorter than the period of the reference phase voltage;

receiving the signal;

detecting when a predetermined point of the unknown phase voltage occurs; and determining the phase angle of the unknown phase voltage relative to the reference phase voltage based on an amount of time measured between reception of the signal and detection of when the predetermined point of the unknown phase voltage occurred.

12. A method for determining the phase angle and wiring phase of a unknown phase voltage relative to a reference phase voltage, the two phases being parasitically coupled, the method comprising the following steps:

connecting a transmitter circuit to a reference electrical outlet having a reference signal with a reference phase voltage;

connecting a receiver circuit to a unknown electrical outlet having a unknown signal with a unknown phase voltage;

sensing a first predetermined point located on the reference signal;

inserting a data packet into the reference signal, the data packet having a duration that is substantially shorter than the period of the reference phase voltage;

receiving the data packet via the parasitic coupling with the receiver circuit;

starting a timer at a start time, upon reception of the data packet;

sensing a second predetermined point located on the unknown signal;

stopping the timer at a stop time, upon sensing the second predetermined point located on the unknown signal;

computing a difference between the start time and the stop time; and determining the phase angle of the unknown phase voltage relative to the reference phase voltage based upon the computed difference.

13. The method for determining the phase angle of an unknown phase voltage relative to a reference signal according to claim 12, wherein the relative position of the first predetermined point located on the reference phase voltage is the same as the relative position of the second predetermined point located on the unknown signal.

* * * * *